(12) United States Patent
Stiles et al.

(10) Patent No.: US 7,575,775 B2
(45) Date of Patent: Aug. 18, 2009

(54) POLYSULFIDE THERMAL VAPOUR SOURCE FOR THIN SULFIDE FILM DEPOSITION

(75) Inventors: James Alexander Robert Stiles, Toronto (CA); Paul Barry Del Bel Belluz, Guelph (CA); John Wesley Moore, Richmond Hill (CA)

(73) Assignee: Ifire IP Corporation, Fort Saskatchewan, Alberta (CA)

( * ) Notice: Subject to any disclaimer, the term of this patent is extended or adjusted under 35 U.S.C. 154(b) by 774 days.

(21) Appl. No.: 10/959,555

(22) Filed: Oct. 6, 2004

(65) Prior Publication Data

US 2005/0142289 A1    Jun. 30, 2005

(51) Int. Cl.
*B05D 5/06* (2006.01)
*C23C 16/00* (2006.01)

(52) U.S. Cl. ............... 427/69; 427/66; 427/255.29; 427/255.31

(58) Field of Classification Search ............ 427/255.29, 427/255.31, 66, 69
See application file for complete search history.

(56) References Cited

U.S. PATENT DOCUMENTS

| | | | |
|---|---|---|---|
| 4,976,988 A | | 12/1990 | Honda |
| 5,246,687 A | * | 9/1993 | Gorre et al. ............... 423/554 |
| 5,507,404 A | * | 4/1996 | Ryu ............... 216/24 |
| 5,554,449 A | * | 9/1996 | Tonomura et al. ............ 428/690 |
| 5,714,274 A | * | 2/1998 | Sugiura et al. ............... 428/690 |
| 5,773,085 A | | 6/1998 | Inoue et al. |
| 5,955,835 A | | 9/1999 | Oh et al. |
| 6,025,677 A | | 2/2000 | Moss, III et al. |
| 6,110,529 A | * | 8/2000 | Gardiner et al. ............. 427/250 |
| 6,447,654 B1 | | 9/2002 | Kosyachkov |
| 6,551,718 B2 | * | 4/2003 | Bellido-Gonzalez ........ 428/469 |
| 6,610,352 B2 | | 8/2003 | Cheong |
| 6,878,973 B2 | * | 4/2005 | Lowery et al. ............... 257/100 |
| 2002/0062858 A1 | * | 5/2002 | Mowles ....................... 136/252 |
| 2002/0081371 A1 | * | 6/2002 | Cheong ........................ 427/8 |
| 2002/0192498 A1 | | 12/2002 | Cheong et al. |
| 2003/0000829 A1 | | 1/2003 | Kosyachkov |
| 2003/0087129 A1 | | 5/2003 | Miura et al. |
| 2003/0118864 A1 | | 6/2003 | Kosyachkov |

FOREIGN PATENT DOCUMENTS

JP      64-001789      1/1989
JP      01168788 A  *  7/1989

OTHER PUBLICATIONS www.chemfinder.com; information for barium thiosulfate.*

* cited by examiner

*Primary Examiner*—Timothy H Meeks
*Assistant Examiner*—Jimmy Lin
(74) *Attorney, Agent, or Firm*—Fay Sharpe LLP

(57) ABSTRACT

The present invention is a low pressure physical vapor deposition method for the deposition of multi element sulfide thin film phosphor compositions for electroluminescent devices where a thermal source comprising a polysulfide compound provides the source of sulfur species for phosphor film deposition and/or annealing. The method is particularly useful for the deposition of phosphors for full color ac electroluminescent displays employing thick film dielectric layers with a high dielectric constant.

32 Claims, 7 Drawing Sheets

DSC - TGA

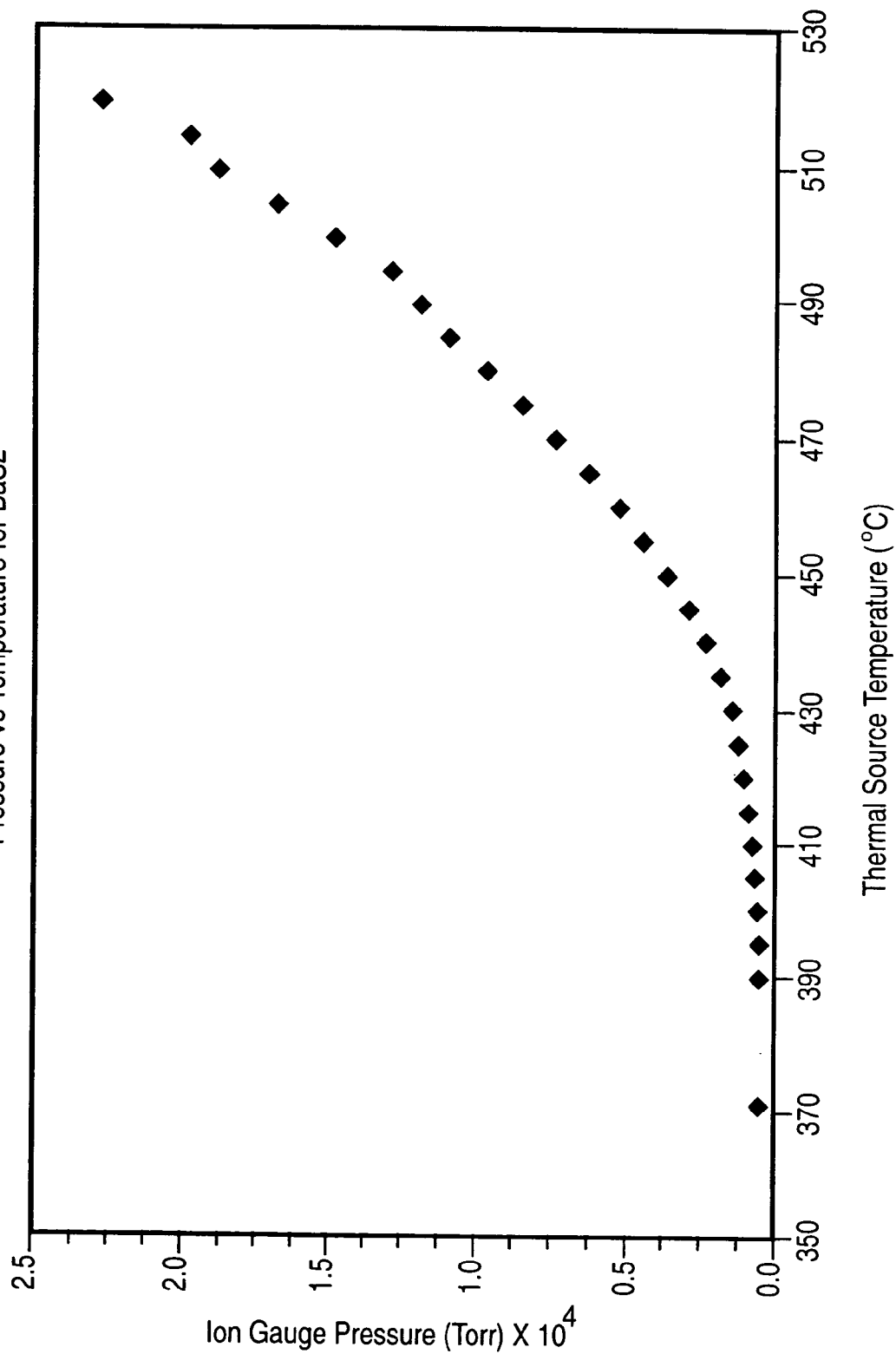

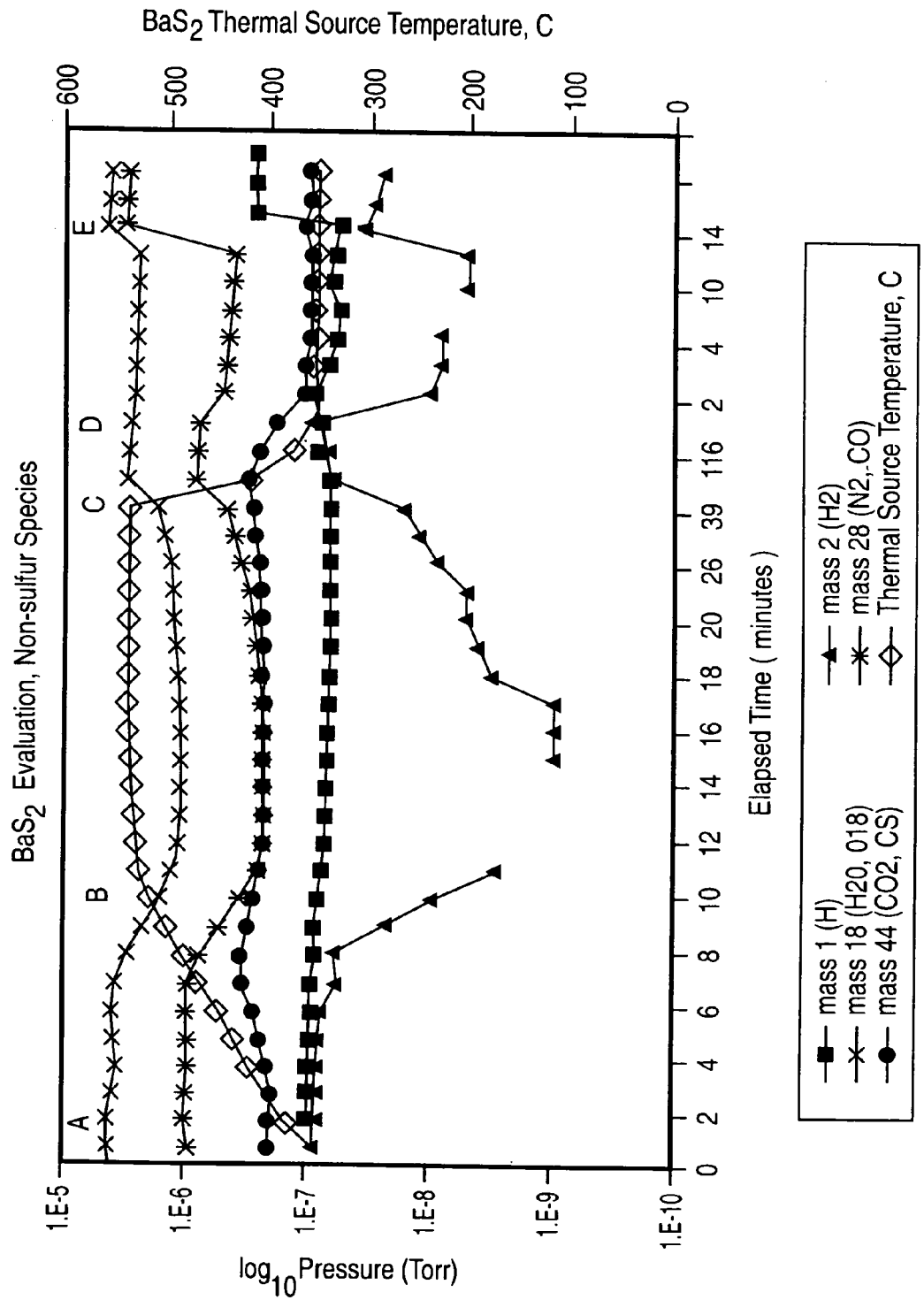

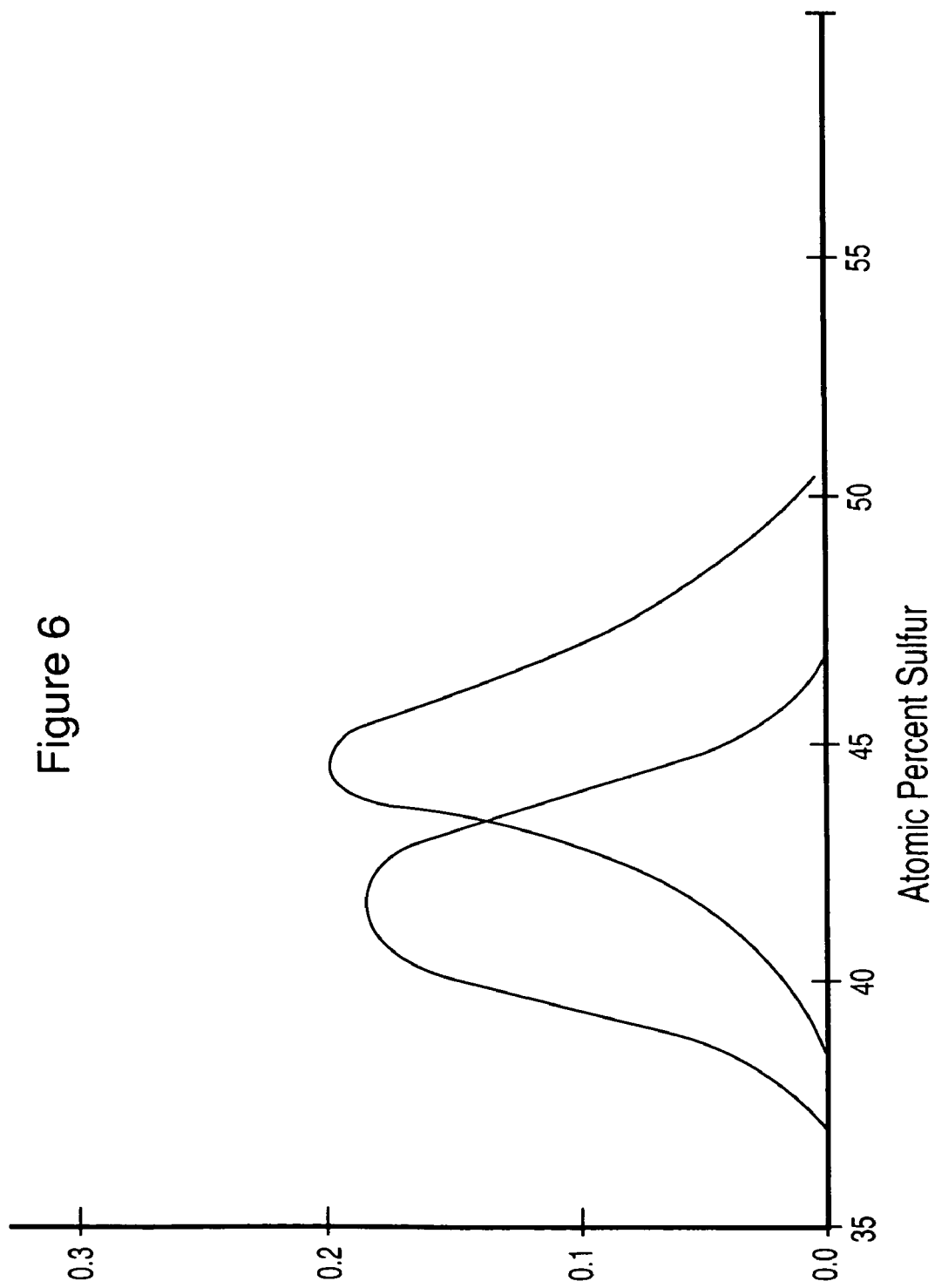

POLYSULFIDE THERMAL VAPOUR SOURCE FOR THIN SULFIDE FILM DEPOSITION

FIELD OF THE INVENTION

The present invention relates to the generation of sulfur vapour from a polysulfide sulfur source in a method for the vacuum deposition of multi element sulfide thin film compositions. More specifically, the invention is a method for the deposition of a phosphor composition where a polysulfide source is used as the source of sulfur vapour species in the deposition and/or annealing of phosphor compositions comprising a thioaluminate, thiogallate or thioindate of Group IIA and Group IIB elements where the source materials include sulfides that contain at least some of the elements comprising the deposited phosphor film. The method is particularly useful for the deposition of phosphors for full colour ac electroluminescent displays employing thick film dielectric layers with a high dielectric constant.

BACKGROUND OF THE INVENTION

Thick film dielectric structures as exemplified by U.S. Pat. No. 5,432,015 (the entirety of which is incorporated herein by reference) are typically fabricated on a rigid substrate and provide superior resistance to dielectric breakdown, as well as a reduced operating voltage compared to thin film electroluminescent (TFEL) displays fabricated on glass substrates. When deposited on a ceramic substrate, the thick film dielectric structure withstands higher processing temperatures than TFEL devices on glass substrates. The increased tolerance to higher temperatures facilitates annealing of the phosphor films at higher temperatures to improve luminosity. However, even with the enhanced luminosity that is obtained, it is desirable to further increase the luminous efficiency of the devices to enable an improvement in overall energy efficiency and reduction in power consumption.

The Applicant has developed various methods for the deposition of phosphors used in thick film dielectric electroluminescent devices as disclosed for example in PCT CA01/01823, U.S. Patent Application Serial No. 2002/0192498A1 and U.S. Pat. No. 6,447,654 (the disclosures of which are incorporated herein in their entirety). In the various methods, hydrogen sulfide is injected into the deposition atmosphere for the deposition of a thin film phosphor composition to minimize sulfur deficiency in the deposited film. U.S. Pat. Nos. 5,554,449, 5,955,835, 6,025,677 and U.S. Patent Application Serial No. 2003/0087129A1 also disclose the use of a hydrogen sulfide atmosphere for luminescent thin-film deposition. In particular, U.S. Pat. No. 5,955,835 discloses the evaporation of solid sulfur to provide a source of sulfur in the deposition chamber rather than simply introducing hydrogen sulfide gas into the chamber with or without a carrier gas.

While the aforementioned methods are generally acceptable, a disadvantage of such methods is that atomic hydrogen from the hydrogen sulfide may be liberated at the growing film surface and may tend to migrate into the thin film composition and underlying substrate with undesirable results. In the case of elemental solid sulfur used as a sulfur source, elemental sulfur tends to volatilize with relatively large molecular sulfur species such as $S_8$ that do not readily react with and become incorporated into the deposited films.

Japanese Patent Application 2001-192813 discloses the use of zinc sulfide as a source material for sulfur in a deposition method for alkaline earth sulfide phosphor films. However, in this method the deposition substrate must be kept sufficiently hot to prevent the zinc from condensing and adhering to the substrate and thereby becoming incorporated into the film composition.

Japanese Patent Application 2000-367759 discloses the use of a hydrogen sulfide cracker combined with a hydrogen absorber in order to avoid hydrogen incorporation in to the film. However, the ability of the hydrogen absorber to efficiently absorb hydrogen in the presence of sulfur vapour is limited.

While the aforementioned patent and patent applications disclose various methods of hydrogen sulfide use to deposit phosphor films for electroluminescent displays, it is always desirable to provide new methods to further improve luminance and luminous efficiency of the phosphor films and further overcome any disadvantages of using prior art methods.

SUMMARY OF THE INVENTION

The invention is a method for the deposition of multi element sulfide-bearing thin film compositions for electroluminescent devices and in particular thick film dielectric electroluminescent devices. The method of the invention is particularly useful for the deposition of phosphor compositions comprising ternary, quaternary or higher sulfur-bearing compounds, preferably selected from the group consisting of thioaluminates, thiogallates and thioindates of at least one element from Groups IIA and IIB of the Periodic Table.

Phosphors deposited in accordance with the method of the invention exhibit a reduced tendency to have a sulfur deficiency in the crystal lattice of the phosphor material than similar phosphors prepared using methods of the prior art.

In general, the method of the invention is a low pressure physical vapour deposition method utilizing a polysulfide compound as the source of sulfur species for phosphor film deposition. Suitable and preferred methods of low pressure physical vapour deposition are selected from the group consisting of thermal evaporation, electron beam evaporation and sputtering.

In an embodiment of the present invention, sulfur species generated from a thermal source comprising a polysulfide compound are introduced into the deposition chamber during a low pressure physical vapour deposition method for depositing a thin film phosphor composition onto a suitable substrate. The sulfur species are volatilized from the thermal source by heating, for example using an electrical resistance heater thermally coupled to the thermal source. Alternatively, the thermal source comprising a polysulfide compound may be provided within the deposition chamber or directly provided as part of the composition of one or more of the source materials that make up the composition of the deposited phosphor.

In a further embodiment of the invention, the thermal source comprising a polysulfide compound is used as a source of sulfur species to maintain a sulfur pressure above the deposited phosphor film as it is being annealed. Annealing is done after deposition. As used during annealing of a deposited phosphor film, the thermal source can be provided and annealing done in the deposition chamber at low pressure or alternatively, in a separate annealing furnace at atmospheric or low pressure.

According to an aspect of the present invention is the use of a thermal source comprising a polysulfide compound as a source of sulfur species in the deposition of thin film phosphor composition by low pressure physical vapour deposition methods. According to another aspect of the present invention is the use of a thermal source comprising a polysulfide compound as a source of sulfur species used during annealing of a deposited thin film phosphor composition.

In accordance with another aspect of the present invention, is a method of providing a sulfur species in a low pressure physical vapour deposition method for depositing a sulfur-bearing thin film phosphor composition onto a substrate in a deposition chamber, the method comprising:

heating a thermal source comprising a polysulfide compound to volatilize sulfur species into the deposition atmosphere.

In accordance with another aspect of the present invention, is a method of providing a sulfur species in a low pressure physical vapour deposition method for depositing ternary, quaternary or higher sulfur-bearing thin film phosphor compositions, preferably selected from the group consisting of thioaluminates, thiogallates and thioindates of at least one element from Groups IIA and IIB of the Periodic Table onto a substrate in a deposition chamber, the method comprising:

heating a thermal source comprising a polysulfide compound to volatilize sulfur species into the deposition atmosphere.

In accordance with another aspect of the present invention, is a method of providing a sulfur species in a low pressure physical vapour deposition method for depositing ternary, quaternary or higher sulfur-bearing thin film phosphor compositions onto a substrate in a deposition chamber, the compositions selected from the group consisting of thioaluminates, thiogallates and thioindates of at least one element from Groups IIA and IIB of the Periodic Table, the method comprising:

providing a thermal source comprising a polysulfide compound, wherein heating of said thermal source creates substantially only sulfur species; and providing said sulfur species within said deposition chamber.

According to yet another aspect of the present invention is a low pressure physical vapour deposition process for the deposition of a thin film phosphor composition of an alkaline earth thiogallate, thioaluminate or thioindate, the method comprising to a deposition chamber containing one or more source materials that make up the thin film phosphor composition;

providing a vapour sulfur species generated by the heating and volatization of a polysulfide compound, said vapour sulfur species providing a source of sulfur for said thin film phosphor composition; and simultaneously volatizing the one or more source materials to effect the deposition of said thin film phosphor composition.

According to yet another aspect of the present invention is a method for annealing a deposited phosphor film composition, said phosphor film composition comprising compositions selected from the group consisting of thioaluminates, thiogallates and thioindates of at least one element from Groups IIA and IIB of the Periodic Table, said method comprising;

subjecting said deposited phosphor film composition to heating under an atmosphere comprising substantially pure sulfur volatized from a thermal source comprising a polysulfide compound.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given herein and from the accompanying drawings and figures, which are given by way of illustration only and do not limit the intended scope of the invention.

FIG. 2 is a graphical representation of the vapour pressure of sulfur generated as a function of source temperature for a barium disulfide source.

FIGS. 3A and 3B are graphical representations of the concentration of vapour species in a vacuum deposition chamber when hydrogen sulfide and when sulfur from barium disulfide are introduced into the chamber.

FIG. 6 is a graphical representation of the distribution of the concentration of sulfur in europium activated barium thioaluminate phosphor films deposited with and without the use of barium disulfide as a sulfur source during deposition.

DETAILED DESCRIPTION OF THE INVENTION

Figure 1:
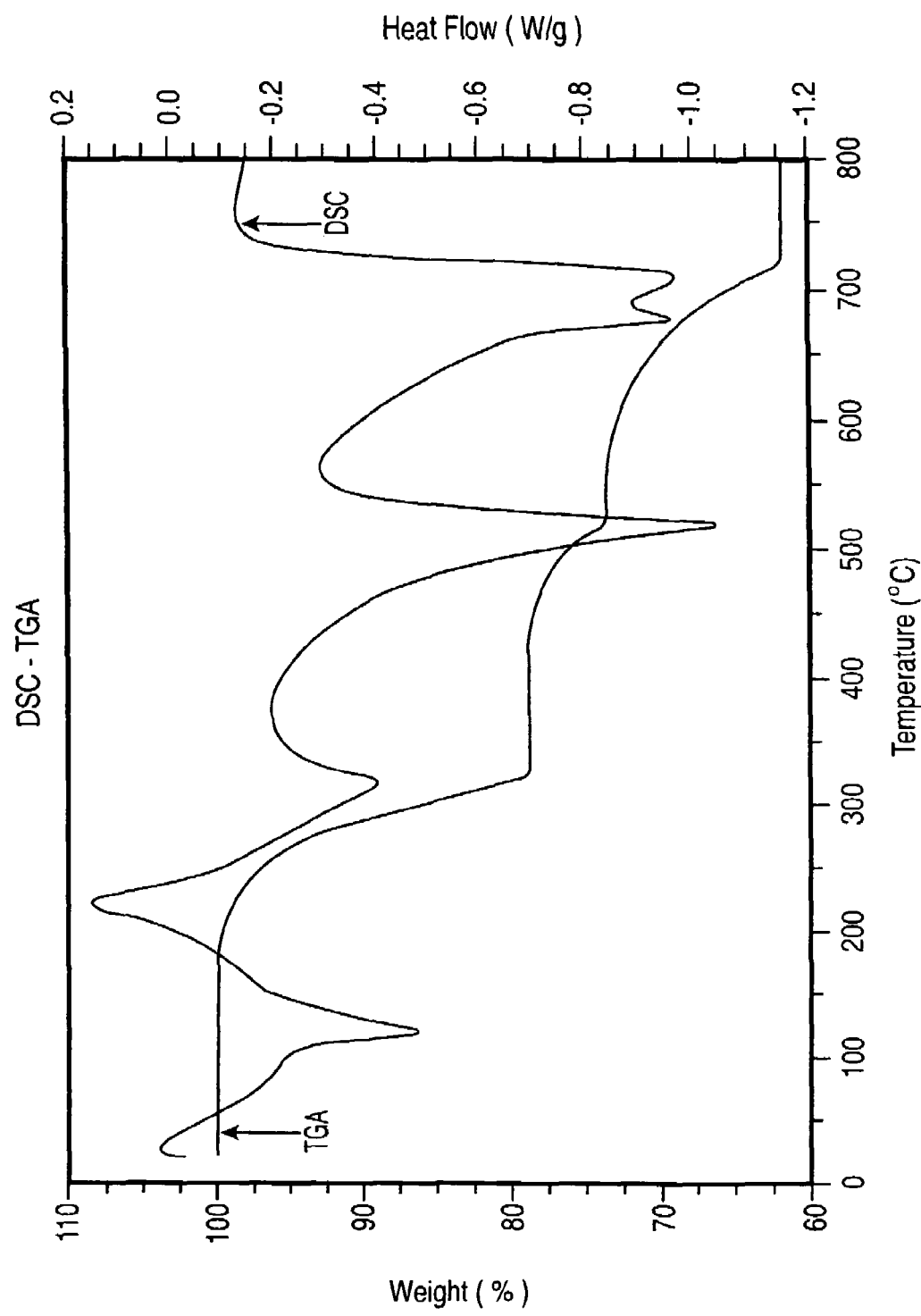
FIG. 1 is a graphical representation of the weight change as a function of temperature of a mixture of barium sulfide and elemental sulfur in a mole ratio of S to BaS greater than 2:1.

The Applicant has now demonstrated that generating sulfur vapour species by the thermal decomposition of a polysulfide compound and providing this generated sulfur vapour species within a deposition chamber during the deposition of a thin film phosphor composition on a substrate provides for enhanced reactivity of the sulfur with the phosphor film being deposited. This in turn, leads to improved luminance and luminous efficiency of the thin film phosphor compositions.

The method is suitable for the deposition of any sulfur-bearing phosphor composition and in particular, is useful for the deposition of ternary, quaternary or higher sulfur-bearing compounds, preferably selected from the group consisting of thioaluminates, thiogallates and thioindates of at least one element from Groups IIA and IIB of the Periodic Table. As such, alkaline earth thiogallates, thioaluminates and thioindate thin phosphor films may be deposited in accordance with the present invention. Preferably, barium thioaluminate thin film phosphor compositions can be deposited in accordance with the present invention.

In the method of the invention, one or more source materials that make up the composition of the deposited phosphor, are deposited onto a suitable substrate using for example, low pressure physical vapour deposition methods such as thermal evaporation, electron beam evaporation and sputtering as are well known to those of skill in the art. The relative volatization of the source materials is controlled to obtain the desired ratio of metal species on the deposition substrate. A gettering or condensing apparatus may be provided adjacent the source(s) in order to remove, prevent or minimize any undesirable sulfur species from depositing on the deposition substrate and thus instead into the deposited phosphor composition in accordance with the methods of Applicant's co-pending U.S. Provisional Patent Application Ser. No.

60/443,540 filed Jan. 20, 2003 (the disclosure of which is incorporated herein by reference in its entirety).

In contrast to the standard injection of hydrogen sulfide into the deposition chamber as is taught in the prior art, a thermal source comprising a polysulfide compound is used as a source of sulfur species. The polysulfide compound decomposes at higher temperatures to release sulfur vapour leaving behind a different residual polysulfide or sulfide compounds that are relatively deficient in sulfur as compared to the initial polysulfide compound used. The rate of sulfur vaporization is controlled by controlling the temperature of the thermal source comprising a polysulfide compound. The polysulfide compound is chosen so that the sulfur release at the desired partial pressure for sulfur occurs within a temperature range where the equilibrium elemental sulfur species comprises primarily atomic or diatomic sulfur. The thermal source may additionally comprise an additional species that may be beneficial in the deposited phosphor film. Such species may replace sulfur to certain degrees and may be for example, selenium. Selenium is partially interchangeable for sulfur in barium thioaluminate phosphor compositions.

The polysulfide compounds are used as supplementary sulfur sources in the deposition of sulfide films without the introduction of extraneous vapour species that may be detrimental to the deposited film. Suitable polysulfides for use in the present invention are disulfides and trisulfides of certain alkaline earth elements, but may comprise any sulfur-bearing compound wherein at least some of the contained sulfur is in an oxidation state equal to or more negative than zero, but less negative than negative two. The polysulfides have the property that they will evolve sulfur when heated to yield sulfur vapour species leaving behind a sulfide compound. Furthermore, the polysulfide sulfur source can be chosen so that it evolves sulfur vapour species compatible with the sulfide film process requirements. For example, if it is desirable to have the sulfur vapour species evolved to comprise primarily atomic or diatomic sulfur, the polysulfide can be chosen so that it evolves sulfur at a temperature where the predominant equilibrium sulfur vapour species is diatomic sulfur at the vacuum deposition system pressure used for the sulfide film deposition. In this way the sulfur species may comprise a mixture of atomic sulfur, which may be evolved from the polysulfide, and diatomic sulfur, the equilibrium species.

The polysulfide compound may be selected from, but not limited to, the group consisting of strontium sulfide, barium disulfide and mixtures thereof that function as the thermal source for sulfur. In aspects, barium disulfide is a preferred polysulfide compound since it decomposes to barium sulfide as it releases sulfur at a rate to provide an acceptable partial pressure of sulfur vapour in the vacuum deposition chamber at a temperature in the range of about 400° C. to about 600° C. in aspects about 500° C. to about 600° C. where the dominant sulfur vapour species is diatomic sulfur. It is understood that any desired temperature or temperature range between about 400° C. to about 600° C. is embodied in the present invention.

The polysulfide compound may be provided and heated remotely from the main deposition chamber with the evolved sulfur species being then introduced into the main phosphor film deposition chamber by example, by injection. Alternatively, the polysulfide compound may be provided and heated to generate sulfur species directly in the main phosphor film deposition chamber. Still, in other aspects, the polysulfide compound may be provided incorporated into one or more of the sulfide source materials that make up the phosphor film composition. In this latter case, the polysulfide compound comprises a polysulfide of one of the metals to be deposited within the phosphor film composition since at the high temperatures used for sulfide vaporization the entire atomic contents of the polysulfide will be vaporized along with the sulfide. For example, if the desired phosphor film composition is europium activated barium thioaluminate, two deposition sources may be used, one comprising aluminum sulfide and the other barium sulfide containing europium doped barium disulfide (i.e. the sulfide source) with the ratio of barium sulfide to barium disulfide set to provide a sufficient rate of volatilization of sulfur from the barium disulfide to realize the desired atomic ratio of sulfur in the deposited film as is understood by those of skill in the art. A preferred range for this ratio is between about 2:1 to 10:1 depending on the deposition conditions employed. The barium disulfide and barium sulfide would be intimately mixed, and the means for vaporization of the barium-containing source material should be such to cause only the surface of the source material to become sufficiently hot that the barium disulfide will decompose to barium sulfide. If this condition is not met, the source material will cause excessive sulfur to be volatilized when the source is initially heated due to decomposition of barium disulfide to barium sulfide throughout the source pellet leaving little remaining as the remainder of the pellet is volatilized.

In one embodiment of the invention, the thermal source comprising the polysulfide compound, such as barium disulfide, is heated in a closed chamber remote from (i.e. separate) from the main phosphor deposition chamber. The closed chamber may have a shuttered hole or port to allow sulfur species vapour released from the decomposing heated polysulfide compound to be injected into the main phosphor deposition chamber at a controlled rate. The closed chamber is maintained at a suitable temperature range to ensure that the sulfur species vapour is primarily diatomic sulfur. In aspects, a second heater may be provided at the exit port to heat the diatomic sulfur sufficiently to convert it substantially to atomic sulfur before it is injected into the main phosphor deposition chamber to enhance the reactivity of the sulfur with the phosphor film being deposited.

The method of the invention is suitable for use with any low pressure physical vapour deposition process such as thermal evaporation, electron beam evaporation and sputtering as is understood by one of skill in the art.

In another embodiment of the invention, the generation of sulfur species by a thermal source polysulfide compound is used to maintain a sulfur pressure above the deposited phosphor film composition while the film is being annealed. Annealing may be conducted in the vacuum deposition chamber at low pressure following deposition of the phosphor film composition or it may be done in a separate annealing furnace at atmospheric or low pressure where the balance of the pressure over the partial pressure generated from the polysulfide compound is provided by an inert gas such as argon. The sulfur species generated from the polysulfide compound as it is being heated at temperatures of about 400° C. to about 600° C. may act to minimize any sulfur deficiency in the deposited phosphor film composition.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

Preparation of Barium Disulfide and Sulfur Release Properties

A sample consisting of 9.2 milligrams of powdered elemental sulfur and 15.1 milligrams of barium sulfide (BaS) powder were mixed and subjected to thermogravimetric analysis. For the analysis the sample was heated under argon containing approximately 150 parts per million of oxygen as an impurity at a temperature ramp rate of 20° C. per minute to 800° C. The relative sample weight loss and the heat flow from the sample as a function of temperature are shown in FIG. 1. As can be seen from the figure, weight loss occurred in several steps, with the last step occurring between about 550° C. and 720° C. There were corresponding endothermic peaks in the heat flow data, indicating evaporation of sulfur from the sample when it was losing weight. The final sample weight was equal to the weight of barium sulfide in the initially prepared sample, consistent with the final sample being barium sulfide with none of the elemental sulfur initially present in the sample remaining X-ray diffraction of the sample once it was cooled to ambient temperature showed it to consist of barium sulfide, thus confirming the analysis.

A similar sample was heated only to 400° C. where the weight loss is consistent with the sample having the nominal composition $Ba_2S_5$. X-ray diffraction of the cooled sample showed it to consist of approximately equal parts of barium trisulfide and barium disulfide, indicating that the nominal compound $Ba_2S_5$ formed with heating to 400° C. was meta stable and disproportionated to form barium trisulfide and barium disulfide when it was cooled to ambient temperature.

Yet another similar sample heated to 550° C. showed a weight loss consistent with a composition of barium disulfide ($BaS_2$). X-ray diffraction analysis of the cooled sample confirmed that it consisted essentially of barium disulfide. The barium disulfide, which was orange-yellow in colour, was sufficiently stable in air to permit easy handling of the material. The above results show that barium disulfide is readily prepared by heating a mixture of barium sulfide and sufficient elemental sulfur to form barium disulfide under argon to a temperature of about 550° C.

Examination of the heat flow data reveals a double peak as the barium disulfide is being heated above 600° C., with a peak at about 680° C. where the sample weight corresponds to the nominal formula $Ba_2S_3$ and a second peak at about 720° C. when the weight loss ceases to leave barium sulfide as previously discussed. This suggests that another meta-stable phase $Ba_2S_3$ is briefly formed as the barium disulfide decomposes to form barium sulfide and sulfur vapour.

Example 2

Relationship between Sulfur Vapour Pressure and Temperature of a Barium Disulfide Source in a Vacuum Deposition Environment About 150 grams of barium disulfide was prepared by mixing elemental sulfur and barium sulfide under a flowing stream of argon that was first passed over a pot of elemental sulfur. The barium sulfide was heated at a rate of 15° C. per minute to 500° C. and then held at that temperature for one hour with the sulfur pot heated to 400° C. to maintain a pressure of sulfur vapour over the barium sulfide. The final product was an orange yellow colour and was confirmed to be barium disulfide using powder x-ray diffraction analysis.

About 16 grams of the prepared barium disulfide was placed in a boron nitride crucible in a thermal source in the chamber of a Denton model SJ/26 electron beam evaporation system. The vacuum system was pumped down to $5 \times 10^{-3}$ millitorr. The vacuum system was then heated to a temperature of about 320° C. and held at that temperature to outgas the system. Next the barium sulfide was heated at a rate of about 2° C. per minute to 540° C. The vacuum atmosphere was monitored using an ionization gauge. When the barium disulfide was heated to 540° C. the system pressure rose as a function of temperature in FIG. 2. The data shows that the sulfur pressure can be varied in a controlled manner by controlling the temperature of the barium disulfide source.

Example 3

Figure 3B:
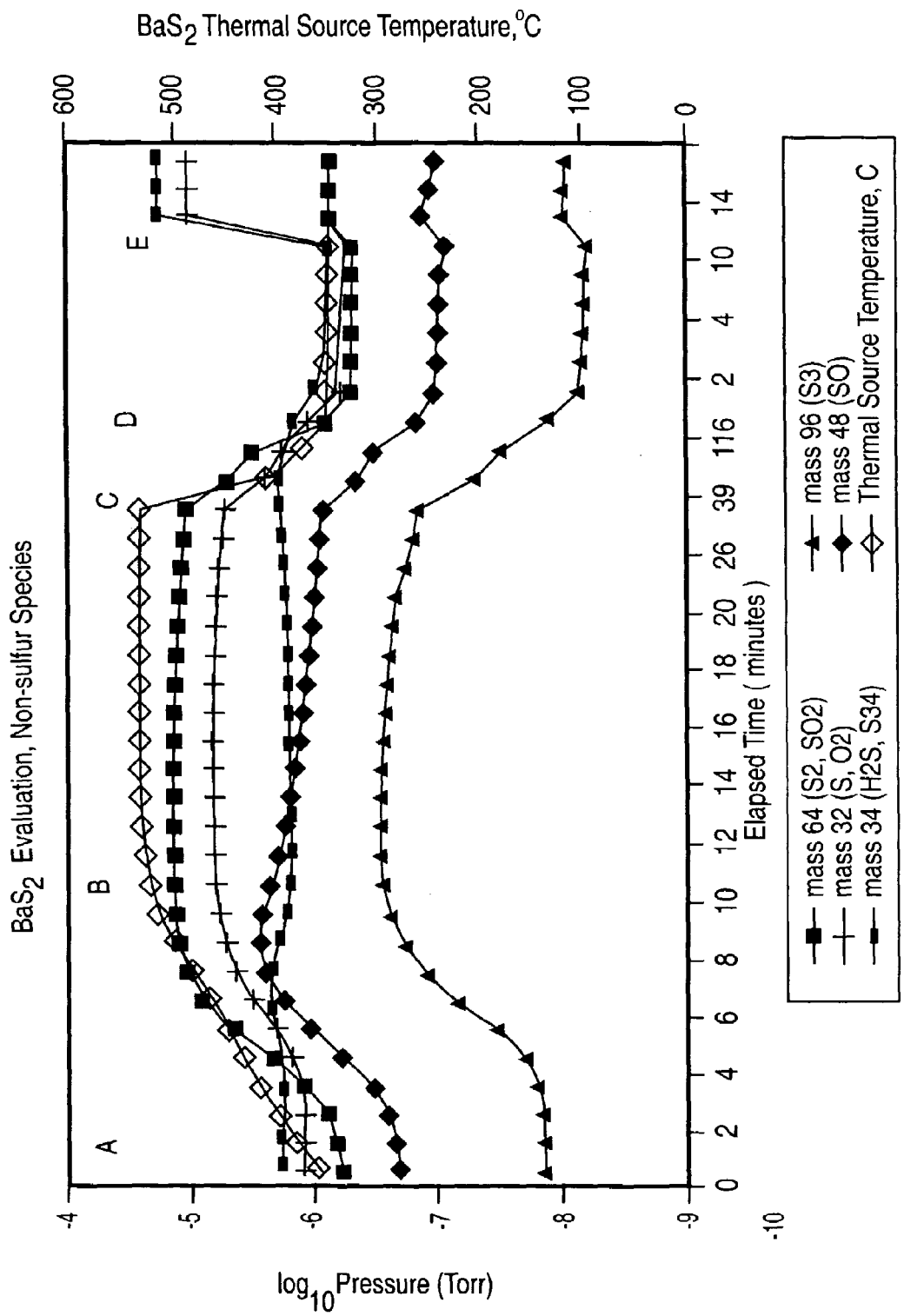

The Effect of Barium Disulfide as a Source of Diatomic and Atomic Sulfur on the Overall Population of Vapour Species in a Vacuum Deposition Environment Barium disulfide was placed in a thermal source in the vacuum deposition system of example 2. The system was fitted with a residual gas analyzer to monitor vapour species in the chamber as a function of time. This data is shown in FIGS. 3A and 3B. Prior to heating the barium disulfide source, but with the overall vacuum system temperature at about 350° C., the system pressure measured by an ionization gauge was approximately $10^{-5}$ torr. The major resident vapour species were water at a partial pressure indicated by the residual gas analyzer somewhat below $10^{-5}$ torr, molecular nitrogen or carbon monoxide (atomic mass 28) hydrogen sulfide and atomic sulfur or molecular oxygen (mass 32) each at a partial pressure of approximately $10^{-6}$ torr, and sulfur dioxide or diatomic sulfur (mass 64), carbon dioxide or carbon monosulfide (mass 44), sulfur monoxide, molecular hydrogen and atomic hydrogen, each at a partial pressure of approximately $10^{-7}$ torr. There was also a very low concentration of triatomic sulfur at an approximate partial pressure of $10^{-8}$ torr.

When the barium disulfide began to be heated, (at point A in FIG. 3B), the partial pressure of diatomic and triatomic sulfur each began to rise. Then when the barium disulfide temperature stabilized at about 540° C. (at point B in FIG. 3B), the partial pressures also stabilized. During the heating of the. barium disulfide, the partial pressure of diatomic sulfur rose by about a factor of 50, while the partial pressure of the atomic mass 32 species which includes atomic sulfur rose by about a factor of 10. The pressure of sulfur monoxide also rose, but then decreased again. In a contrary trend, the partial pressure of water, nitrogen or carbon monoxide and molecular hydrogen all decreased significantly. There was little change in the hydrogen sulfide or atomic hydrogen concentration. When the temperature of the barium sulfide started to decrease again (at point C in FIG. 3B) the concentration of all measured vapour species began to approach their original values and reached those values when the barium sulfide cooled to the system temperature of 350° C. (at point D in FIGS. 3A and 3B).

Example 4

Effect on Vapour Species Populations in the Vacuum Deposition Dystem when Hydrogen Sulfide is Injected at a Rate to Reach a Pressure Typical to that in Prior Art Deposition Methods of Thioaluminate Phosphor Films Hydrogen sulfide was injected at a rate of 2 sccm into the deposition chamber of example 2. This resulted in an increase in the system pressure as measured by the ionization gauge to about $10^{-4}$ torr, lower than was the case when the barium disulfide was heated to 540° C. The partial pressure of hydrogen sulfide and atomic sulfur with the hydrogen sulfide flow as measured by the residual gas analyzer rose by about a factor of 50 to a value of approximately $10^{-5}$ torr. Also the partial pressure of atomic and molecular hydrogen each rose by about a factor of 7, the former to about $5\times10^{-7}$ torr. These changes are likely due to cracking or disproportionation of some of the hydrogen sulfide in the low pressure environment. The partial pressure of mass 28 species also rose by about a factor of 10, possibly due to contamination of the hydrogen sulfide supply with nitrogen. There was no substantial change in the partial pressure of water, carbon dioxide, carbon monosulfide or diatomic or triatomic sulfur. The data are shown as a function of time beginning at point E in FIGS. 3A and 3B.

There are several important differences between the vapour species present in the deposition system when sulfur is evaporated from barium disulfide as opposed to hydrogen sulfide. When barium disulfide is used as the sulfur source, there is no increase in the concentration of atomic hydrogen and a decrease in the concentration of molecular hydrogen. By contrast, there is a substantial increase in the concentration of both atomic and molecular hydrogen when hydrogen sulfide is injected. Further, the concentrations of oxygen-containing species in the background environment are reduced when barium disulfide is used as the sulfur source, whereas they are not when hydrogen sulfide is used as the source. It is possible that the reduction in the measured oxygen-containing species is due to the formation of COS and related species in the former case, although these species were not measured during the experiment. Finally, there is a difference in the relative population of sulfur species. When barium disulfide is used as a sulfur source, the dominant sulfur species in diatomic sulfur, with a lower but still significant fraction of atomic sulfur that may be largely due to fragmentation of $S_2$ in the residual gas analyzer. There is also about 1 percent triatomic sulfur present. By contrast, when hydrogen sulfide is the sulfur source, the dominant species apart from hydrogen sulfide is atomic sulfur, with no appreciable concentration of diatomic or triatomic sulfur.

Figure 4:
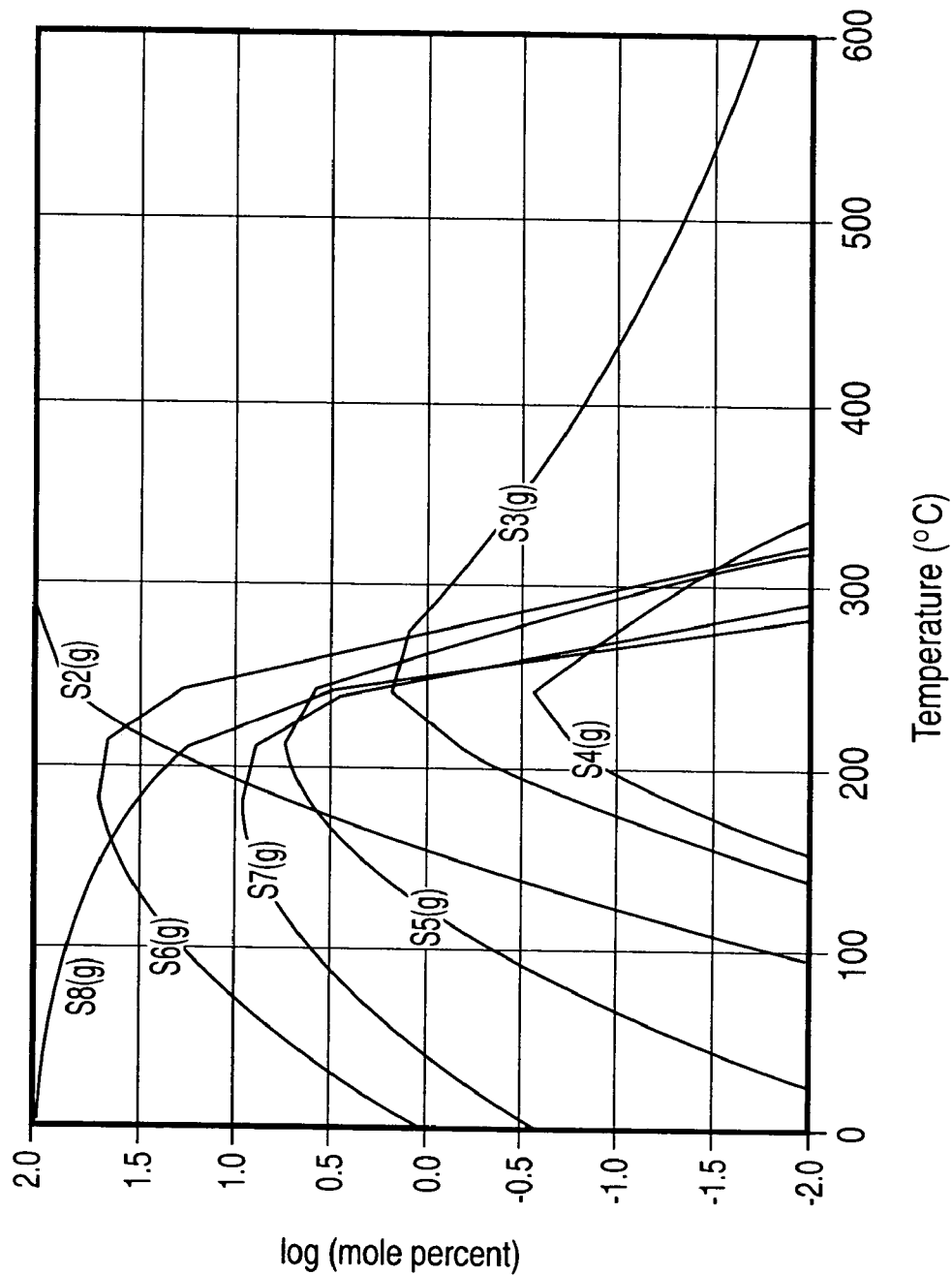
FIG. 4 is a graphical representation of the equilibrium distribution of sulfur vapour species at a typical vacuum deposition pressure of $10^{-6}$ atmospheres.

The distribution of sulfur species obtained when barium disulfide is heated can be related to the expected equilibrium population of sulfur species. FIG. 4 shows the expected relative abundance of sulfur vapour species in equilibrium as a function of temperature at a pressure of $10^{-6}$ atmospheres ($8\times10^{-4}$ torr) calculated from thermodynamic data using HSC Chemistry software available from Outokumpu Research Oy of Pori, Finland. The ratio of partial pressures of $S_3$ to $S_2$ of about 1 percent at a temperature near 300° C. from FIG. 4 is comparable to that measured by the residual gas analyzer in the vacuum deposition chamber when sulfur was evolved from barium disulfide, as shown in FIG. 3B. This is consistent with the estimated system temperature of 340° C. and indicates that the sulfur vapour species in the deposition system are close to being in thermal equilibrium. The partial pressure of mass 32 corresponding to atomic sulfur measured when sulfur is evolved from barium disulfide is difficult to analyze, since a significant contribution to it is made from fragmentation of $S_2$ in the residual gas analyzer.

Figure 5:
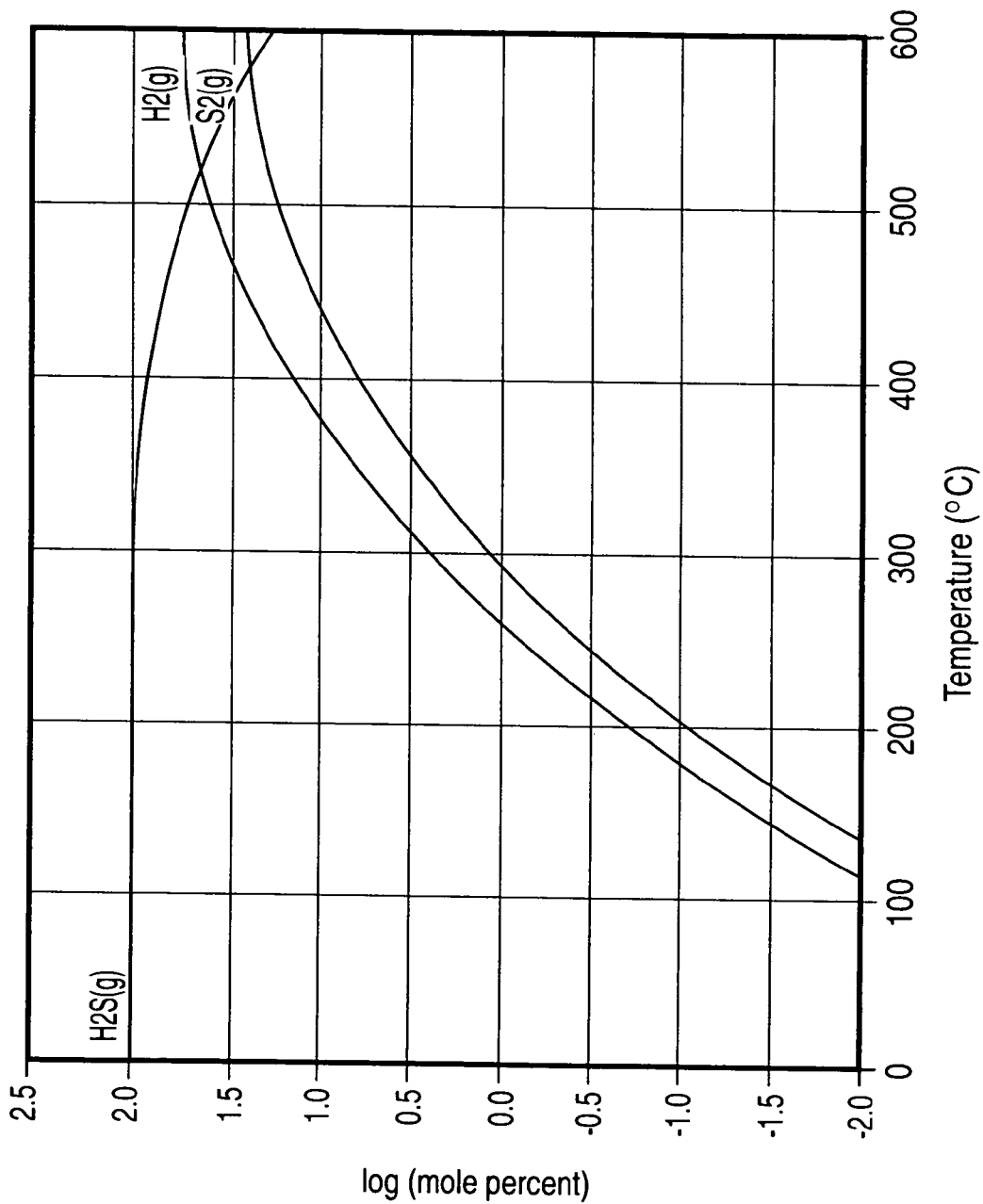
FIG. 5 is a graphical representation of the equilibrium distribution of vapour species generated from hydrogen sulfide at a typical vacuum deposition pressure of $10^{-6}$ atmospheres.

When hydrogen sulfide is injected in to the deposition chamber, it also appears to approach thermal equilibrium with its component species, as evidenced by the increase in the hydrogen partial pressure when hydrogen sulfide is injected. FIG. 5 shows the expected relative abundance of vapour species from generated from hydrogen sulfide in equilibrium as a function of temperature at a pressure of $10^{-6}$ atmospheres ($8\times10^{-4}$ torr) calculated from thermodynamic data using the HSC Chemistry software. The partial pressure ratio of $H_2$ to $H_2S$ of about 2 percent at a temperature near 300° C. from FIG. 5 is comparable to that measured in the deposition chamber by the residual gas analyzer, allowing for fragmentation of the $H_2$ to atomic hydrogen in the analyzer, when hydrogen sulfide was injected in into the chamber. This is further evidence that the vapour species in the vacuum deposition chamber are close to being in thermal equilibrium with an equilibrium temperature near 300° C. although the analysis of species from hydrogen sulfide is more difficult to analyze due to fragmentation that occurs in the residual gas analyzer. The ratio of the partial pressure of $S_3$ to $S_2$ is also invariant throughout the experiments described above, providing yet further evidence of the near equilibrium of the vapour species at a temperature near 300° C. It should be noted however that the ratio of atomic hydrogen to $H_2$ is not invariant throughout the experiments, indicating that there is a source of atomic hydrogen within the vacuum deposition chamber, most likely due to degassing from the chamber walls, that does not reach equilibrium with the other vapour species.

Example 5

Sulfur Concentration in Europium Activated Barium Thioaluminate Phosphor Films Deposited Using Electron Beam Evaporation with and without a Supplementary Source of Sulfur Vapour from Barium Disulfide Introduced into the Deposition Chamber during Film Deposition The supplementary sulfur was introduced into the deposition chamber under conditions similar to those taught in example 4. A large number of films were deposited on silicon substrates according to the method exemplified in U.S. patent application Ser. No. 09/747,315 (hereby incorporated by reference in its entirety). The relative sulfur concentration in the films with and without the supplementary sulfur source is shown in FIG. 6. As can be seen from the data, the films deposited using the supplementary sulfur source had on average a sulfur content of 46 atomic percent as compared to 42 atomic percent without the use of the supplementary sulfur source. For comparison, the sulfur content of the nominal thioaluminate compound ($BaAl_2S_4$) is 57 atomic percent. The difference between the measured sulfur concentration and the theoretical concentration is made up by oxygen incorporation into the film. Generally, the luminance derived from these phosphor films when they are incorporated into electroluminescent devices is increased when the sulfur concentration is increased and the oxygen concentration is reduced.

Although preferred embodiments have been described herein in detail it is understood by those of skill in the art that using no more than routine experimentation, many equivalents to the specific embodiments of the invention described herein can be made. Such equivalents are intended to be encompassed by the scope of the claims appended hereto.

The invention claimed is:

1. A method of providing a sulfur species in a low pressure physical vapour deposition method for depositing a sulfur-bearing thin film phosphor composition onto a substrate in a deposition chamber, the method comprising:

heating a thermal source comprising a sulfide compound to volatize sulfur species into the deposition atmosphere during deposition of said thin film phosphor composition, wherein said sulfide compound is a polysulfide compound selected from disulfides and trisulfides of an alkaline earth element or said sulfur compound is a sulfur bearing compound wherein at least some of the contained sulfur is in an oxidation state equal or more negative than zero but greater than negative two.

2. The method of claim 1, wherein said sulfur-bearing thin film phosphor composition is a ternary, quaternary or higher sulfur-bearing thin film phosphor compositions selected from the group consisting of thioaluminates, thiogallates and thioindates of at least one element from Groups IIA and IIB of the Periodic Table.

3. The method of claim 2, wherein said thin film composition is selected from the group consisting of an alkaline earth thiogallate, an alkaline earth thioaluminate and an alkaline earth thioindate.

4. The method of claim 3, wherein said thin film composition is a barium thioaluminate.

5. The method of claim 1, wherein said sulfide compound is heated in a closed chamber remote from said deposition chamber and said sulfur species is injected into the deposition chamber.

6. The method of claim 1, wherein said sulfide compound is provided within said deposition chamber.

7. The method of claim 1, wherein said sulfide compound is heated at a temperature of about 400° C. to about 600° C.

8. The method of claim 7, wherein said temperature is about 500° C. to about 600° C.

9. The method of claim 7, wherein said polysulfide compound is barium disulfide.

10. The method of claim 7, wherein said method further comprises annealing the deposited thin film phosphor composition.

11. The method of claim 10, wherein annealing is conducted by subjecting said deposited thin film phosphor composition to heating under an atmosphere comprising substantially pure sulfur volatized from a thermal source comprising a polysulfide compound.

12. The method of claim 10, wherein annealing is done in said deposition chamber.

13. The method of claim 10, wherein annealing is done in a separate annealing furnace.

14. The method of claim 1, wherein said low pressure physical vapour deposition method is selected from thermal evaporation, electron beam evaporation and sputtering.

15. A low pressure physical vapour deposition process for the deposition of a thin film phosphor composition of an alkaline earth thiogallate, thioaluminate or thioindate, the method comprising to a deposition chamber containing one or more source materials that make up the thin film phosphor composition;

providing a vapour sulfur species generated by the heating and volatization of a sulfide compound, said vapour sulfur species providing a source of sulfur for said thin film phosphor composition; and simultaneously volatizing the one or more source materials to effect the deposition of said thin film phosphor composition, wherein said sulfide compound is a polysulfide compound selected from disulfides and trisulfides of an alkaline earth element or said sulfur compound is a sulfur bearing compound wherein at least some of the contained sulfur is in an oxidation state equal or more negative than zero but greater than negative two.

16. The method of claim 15, wherein said sulfide compound is heated in a closed chamber remote from said deposition chamber and said vapour sulfur species is injected into the deposition chamber.

17. The method of claim 15, wherein said sulfide compound is provided within said deposition chamber.

18. The method of claim 15, wherein said sulfide compound is incorporated into said one or more source materials that make up the thin film phosphor composition.

19. The method of claim 15, wherein said sulfide compound is heated at a temperature of about 400° C. to about 600° C.

20. The method of claim 19, wherein said temperature is about 500° C. to about 600° C.

21. The method of claim 19, wherein said polysulfide compound is barium disulfide.

22. The method of claim 15, wherein said low pressure physical vapour deposition process is selected from thermal evaporation, electron beam evaporation and sputtering.

23. The method of claim 15, wherein said thin film composition is a barium thioaluminate.

24. The method of claim 15, wherein said method further comprises annealing the deposited phosphor thin film composition.

25. The method of claim 24, wherein annealing is conducted by subjecting said deposited thin film phosphor composition to heating under an atmosphere comprising substantially pure sulfur volatized from a thermal source comprising a polysulfide compound.

26. The method of claim 25, wherein annealing is done in said deposition chamber.

27. The method of claim 25, wherein annealing is done in a separate annealing furnace.

28. A method for annealing a deposited phosphor film composition, said phosphor film composition comprising compositions selected from the group consisting of thioaluminates, thiogallates and thioindates of at least one element from Groups IIA and IIB of the Periodic Table, said method comprising;

subjecting said deposited phosphor film composition to heating under an atmosphere comprising substantially pure sulfur volatized from a thermal source comprising a sulfide compound, wherein said sulfide compound is a polysulfide compound selected from disulfides and trisulfides of an alkaline earth element or said sulfur compound is a sulfur bearing compound wherein at least some of the contained sulfur is in an oxidation state equal or more negative than zero but greater than negative two.

29. The method of claim 28, wherein annealing is done in said deposition chamber.

30. The method of claim 28, wherein annealing is done in a separate annealing furnace.

31. The method of claim 30, wherein said thin film composition is a barium thioaluminate.

32. The method of claim 28, wherein said polysulfide compound is barium disulfide.

* * * * *